(12) United States Patent
Obinata et al.

(10) Patent No.: US 9,974,162 B2
(45) Date of Patent: May 15, 2018

(54) INTERCONNECTION SUBSTRATE AND METHOD OF INSPECTING INTERCONNECTION SUBSTRATE

(71) Applicant: SHINKO ELECTRIC INDUSTRIES CO., LTD., Nagano (JP)

(72) Inventors: Tsukasa Obinata, Nagano (JP); Yusuke Karasawa, Nagano (JP); Hideyuki Tako, Nagano (JP); Goshi Imai, Nagano (JP); Suguru Yamato, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days. days.

(21) Appl. No.: 15/447,374

(22) Filed: Mar. 2, 2017

(65) Prior Publication Data

US 2017/0273175 A1    Sep. 21, 2017

(30) Foreign Application Priority Data

Mar. 16, 2016    (JP) .................................. 2016-051897

(51) Int. Cl.
*H05K 1/02* (2006.01)
*G06K 19/06* (2006.01)
*H05K 1/11* (2006.01)

(52) U.S. Cl.
CPC ..... *H05K 1/0266* (2013.01); *G06K 19/06028* (2013.01); *H05K 1/113* (2013.01); *H05K 2201/10227* (2013.01)

(58) Field of Classification Search
CPC . H05K 1/02; H05K 1/11; G06K 19/06; G06K 19/06028; G06K 19/06037; G06K 19/0614; G06K 1/12; G06K 7/12

USPC .......................................................... 257/797
See application file for complete search history.

(56) References Cited

U.S. PATENT DOCUMENTS

| | | | |
|---|---|---|---|
| 8,431,827 B2* | 4/2013 | Nishikawa | H05K 1/0266 174/250 |
| 9,342,772 B2* | 5/2016 | Chou | G06K 19/06037 |
| 9,811,693 B2* | 11/2017 | Kawashima | G06K 7/065 |
| 2008/0149732 A1* | 6/2008 | Lo | H05K 1/0266 235/492 |

(Continued)

FOREIGN PATENT DOCUMENTS

JP    2006-259204    9/2006

*Primary Examiner* — Timothy Thompson
*Assistant Examiner* — Michael F McAllister
(74) *Attorney, Agent, or Firm* — IPUSA, PLLC

(57) ABSTRACT

An interconnection substrate having a barcode includes a core layer, an interconnection layer over a first surface of the core layer, an insulating layer to cover the interconnection layer, and one or more additional interconnection layers over the insulating layer, wherein the barcode includes cells arranged at spaced intervals, and a cell pattern is made by forming penetrating holes through the core layer in some of the cells but not in remaining ones of the cells, wherein the penetrating holes are filled with resin, and an end face of the resin is exposed on the same side as the first surface such that the interconnection layer is situated in a surrounding area of the end face but not over the end face, and wherein a number of interconnection layers over the end face is smaller than a number of interconnection layers in the surrounding area of the end face.

7 Claims, 9 Drawing Sheets

(56) References Cited

U.S. PATENT DOCUMENTS

| | | | | |
|---|---|---|---|---|
| 2015/0223899 A1* | 8/2015 | Kieser | ............... | A61B 17/7004 |
| | | | | 264/308 |
| 2015/0363682 A1* | 12/2015 | Obeng | ............. | G06K 19/06159 |
| | | | | 235/375 |
| 2016/0055403 A1* | 2/2016 | Chou | ............... | G06K 19/06037 |
| | | | | 235/494 |

* cited by examiner

INTERCONNECTION SUBSTRATE AND METHOD OF INSPECTING INTERCONNECTION SUBSTRATE

CROSS-REFERENCE TO RELATED APPLICATIONS

The present application is based upon and claims the benefit of priority from the prior Japanese Patent Application No. 2016-051897 filed on Mar. 16, 2016, with the Japanese Patent Office, the entire contents of which are incorporated herein by reference.

FIELD

The disclosures herein relate to an interconnection substrate and a method of inspecting an interconnection substrate.

BACKGROUND

An interconnection substrate may have a barcode, which is scanned for the purpose of managing the process of manufacturing interconnection substrates. The surface metal layer of a core layer that includes a resin layer and the metal layer disposed thereon may be gouged by laser, for example, to form a hole in the metal layer or to form a hole into the resin layer through the metal layer, thereby producing a rectangular cell. A plurality of rectangular cells in contact with one another are then arranged in a matrix form to form a two-dimensional barcode (see Patent Document 1, for example).

However, a conventional barcode formed by engraving the surface of an interconnection substrate as described above is not viewable after an insulating layer made of resin and/or an interconnection layer made of metal are formed on the barcode. In such a state, a conventional optical barcode reader that scans barcode cells and the background by detecting color tones or surface unevenness is unable to perform a scan.

Accordingly, it may be preferable to provide an interconnection substrate having a barcode that is readable even after an insulating layer and/or an interconnection layer are laminated on the barcode.

[Patent Document 1] Japanese Patent Application Publication No. 2006-259204

SUMMARY

According to an aspect of the embodiment, an interconnection substrate having a barcode formed therein includes a core layer, an interconnection layer formed over a first surface of the core layer, an insulating layer formed over the first surface of the core layer to cover the interconnection layer, and one or more additional interconnection layers formed over the insulating layer, wherein the barcode includes a plurality of cells arranged at spaced intervals, and a cell pattern indicative of predetermined information is made by forming penetrating holes through the core layer in some of the cells but not in remaining ones of the cells, wherein the penetrating holes are filled with resin, and a first end face of the resin is exposed on the same side as the first surface of the core layer such that the interconnection layer is situated in a surrounding area of the first end face but not over the first end face, and wherein a number of the one or more additional interconnection layers over the first end face is smaller than a total number of the interconnection layer plus the one or more additional interconnection layers over the first surface of the core layer in the surrounding area of the first end face.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

<First Embodiment>
[Overall Structure of Interconnection Substrate]

Figure 1A:
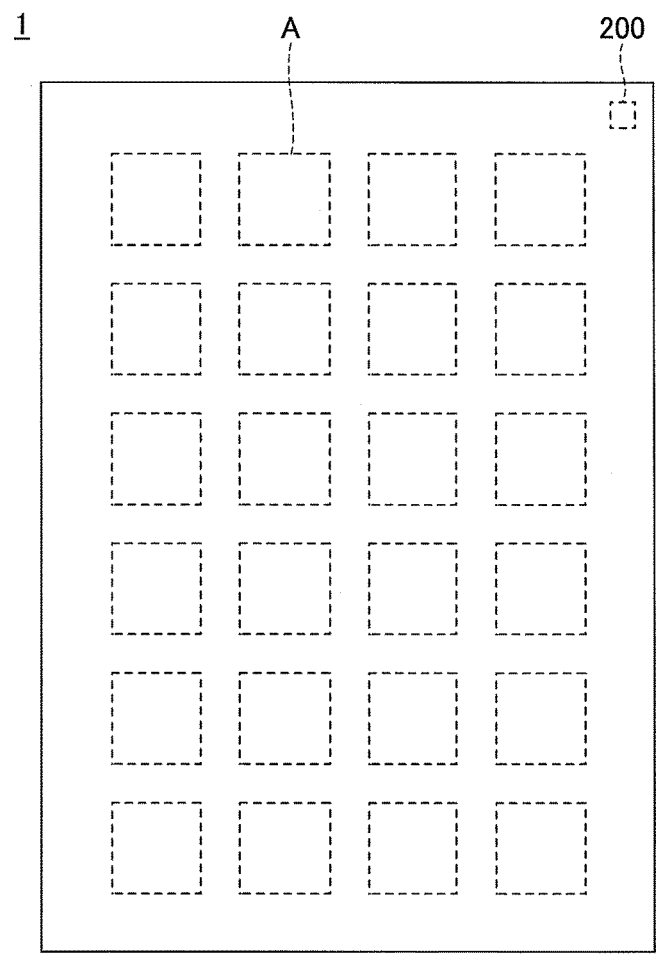
FIGS. 1A and 1B are drawings illustrating an example of an interconnection substrate according to a first embodiment.
Figure 1B:
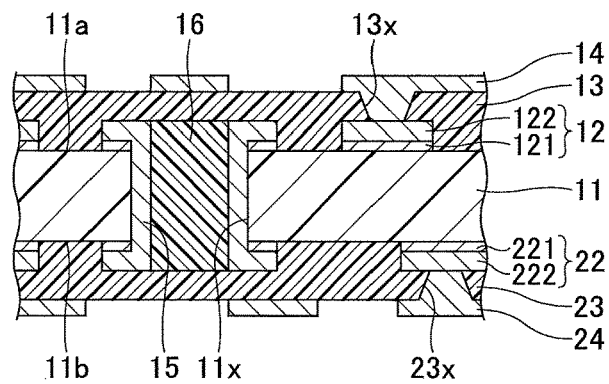

In the following, a description will be first given of the overall structure of an interconnection substrate according to a first embodiment. FIGS. 1A and 1B are drawings illustrating an example of the interconnection substrate according to the first embodiment. FIG. 1A illustrates a plan view, and FIG. 1B illustrates an enlarged cross-sectional view of a product area A illustrated in FIG. 1A.

By referring to FIGS. 1A and 1B, an interconnection substrate 1 is a large-sized interconnection substrate (i.e., large-sized substrate) in which a plurality of product areas A are arranged at spaced intervals in a matrix. The product areas A may be turned into separate pieces each serving as an interconnection substrate. In FIGS. 1A and 1B, the interconnection substrate 1 has twenty four product areas A. This is only an example, and the interconnection substrate 1 may have any number of product areas A. The product areas A may not be spaced apart from each other, but may be formed in contact with each other.

The interconnection substrate 1 has a barcode 200 formed outside the product areas A. The interconnection substrate 1 includes an interconnection layer 12, an insulating layer 13, an interconnection layer 14, a through interconnect 15, a resin 16, an interconnection layer 22, an insulating layer 23, and an interconnection layer 24.

In the present embodiment, for the sake of convenience, the side of the interconnection substrate 1 on which the interconnection layer 14 is situated is referred to as an upper side or a first side, and the side on which the interconnection layer 24 is situated is referred to as a lower side or a second side. Further, the surface of a given member situated toward the interconnection layer 14 is referred to as an upper surface or a first surface, and the other surface of the member situated toward the interconnection layer 24 is referred to as a lower surface or a second surface. It may be noted, however, that the interconnection substrate 1 may be used in an upside-down position, or may be placed at any angle. Further, a plan view refers to a view taken in the direction normal to a first surface 11a of a core layer 11, and a plan shape is a shape as viewed in the direction normal to the first surface 11a of the core layer 11.

The core layer 11 is situated around the center of the interconnection substrate 1 in the thickness direction thereof. The core layer 11 may be a glass epoxy substrate made by impregnating a glass cloth with thermosetting insulating resin such as epoxy-based resin, for example. The core layer 11 may be a substrate made by impregnating a woven cloth or non-woven cloth of glass fiber, carbon fiber, aramid fiber, or the like with thermosetting insulating resin such as epoxy-based resin. The thickness of the core layer 11 may be about 200 to 1000 micrometers, for example. It may be noted that a glass cloth or the like is not illustrated in each drawing.

The interconnection layer 12 is formed on the first surface 11a of the core layer 11. The interconnection layer 12 is an interconnection pattern including a metal layer 121 and a metal layer 122. The interconnection layer 22 is formed on a second surface 11b of the core layer 11. The interconnection layer 22 is an interconnection pattern including a metal layer 221 and a metal layer 222. The interconnection layer 12 (i.e., the metal layers 121 and 122) and the interconnection layer 22 (i.e., the metal layers 221 and 222) are made of a material such as copper (Cu). The thickness of each of the interconnection layers 12 and 22 may approximately be 10 to 20 micrometers, for example. Each of the metal layers 122 and 222 may be comprised of a plurality of layers (e.g., a structure made by laminating a non-electrolytic plating layer and an electrolytic plating layer). The interconnection layer 12 is a representative example of an interconnection layer used in the present invention.

A penetrating hole 11x penetrates the core layer 11, the metal layer 121, and the metal layer 221. The plan shape of the penetrating hole 11x may be a circle having a diameter of approximately 100 to 500 micrometers. The pitch of penetrating holes 11x may approximately be 200 to 1000 micrometers, for example. The inner wall of the penetrating hole 11x has the through interconnect 15 formed thereon. The interconnection layer 12 is electrically connected to the interconnection layer 22 through the through interconnect 15. Copper (Cu) may be used as the material of the through interconnect 15. The through interconnect 15 may be formed integrally with, as a continuous part of, the metal layers 122 and 222. In such a case, the portion situated on the inner wall of the penetrating hole 11x is regarded as the through interconnect 15.

The resin 16 fills the inner space of the through interconnect 15 in the penetrating hole 11x. A first end face of the resin 16 may be flush with the upper surface of the metal layer 122, for example. A second end face of the resin 16 may be flush with the lower surface of the metal layer 222, for example. Insulating resin such as epoxy-based resin may be used as the material of the resin 16.

The insulating layer 13 is formed on the first surface 11a of the core layer 11 such as to cover the interconnection layer 12 and the first end face of the resin 16. Thermosetting insulating resin having epoxy-based resin as the main component may be used as the material of the insulating layer 13. The thickness of the insulating layer 13 may be about 20 to 45 micrometers, for example. The insulating layer 13 may include filler such as silica ($SiO_2$).

The interconnection layer 14 is formed on the first side of the insulating layer 13 and electrically coupled with the interconnection layer 12. The interconnection layer 14 includes a via interconnect that fills a via hole 13x penetrating the insulating layer 13 to expose the first surface of the interconnection layer 12, and also includes an interconnection pattern formed on the first surface of the insulating layer 13. The shape of the via hole 13x is a frustum of a right circular cone having an upper end toward the interconnection layer and a bottom end at the upper surface of the interconnection layer 12, with the diameter of the upper end being larger than the diameter of the bottom end. The interconnection layer 14 is a representative example of one or more additional interconnection layers used in the present invention. One or more additional interconnection layers may be stacked over the interconnection layer 14 with an insulating layer intervening therebetween.

The insulating layer 23 is formed on the second surface 11b of the core layer 11 such as to cover the interconnection layer 22 and the second end face of the resin 16. The material and thickness of the insulating layer 23 may be the same as or similar to those of the insulating layer 13. The insulating layer 23 may include filler such as silica ($SiO_2$).

The interconnection layer 24 is formed on the second side of the insulating layer 23 and electrically coupled with the interconnection layer 22. The interconnection layer 24 includes a via interconnect that fills a via hole 23x penetrating the insulating layer 23 to expose the second surface of the interconnection layer 22, and also includes an interconnection pattern formed on the second surface of the insulating layer 23. The shape of the via hole 23x is a frustum of a right circular cone having a lower end toward the interconnection layer and a top end at the lower surface of the interconnection layer 22, with the diameter of the lower end being larger than the diameter of the top end.

Additional one or more insulating layers, interconnection layers, solder resists, and so on may be disposed on the interconnection layer 14 as well as on the interconnection layer 24. Moreover, external connection terminals such as solder balls may be disposed.

[Barcode]

Figure 2A:
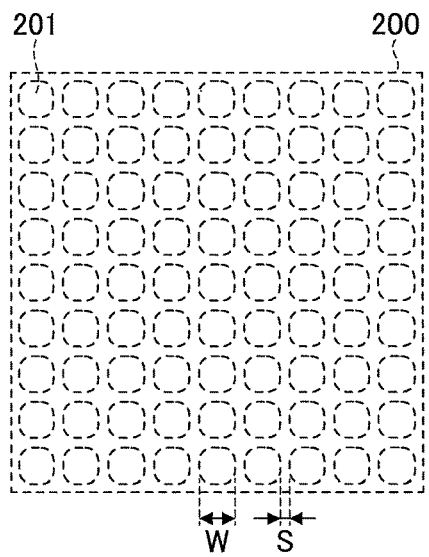
FIGS. 2A through 2C are drawings illustrating an example of the structure of a barcode formed in the interconnection substrate.

In the following, a description of a barcode disposed in the interconnection substrate will be given. FIG. 2A is a plan view illustrating an example of the positions of cells 201. As illustrated in FIG. 2A, a plurality of cells 201 are arranged at spaced intervals in a matrix in the area of the barcode 200. FIG. 2A shows a state before a cell pattern is formed.

The plan shape of a cell 201 may be a square with rounded four corners, for example. This is not a limiting example, and the shape may be circular or the like. A width W of the cell 201 (i.e., the diameter of the cell 201 if the shape is circular) may approximately be 200 to 400 micrometers, for example. A space S between two adjacent cells 201 may approximately be 20 to 30 micrometers, for example.

Figure 2B:
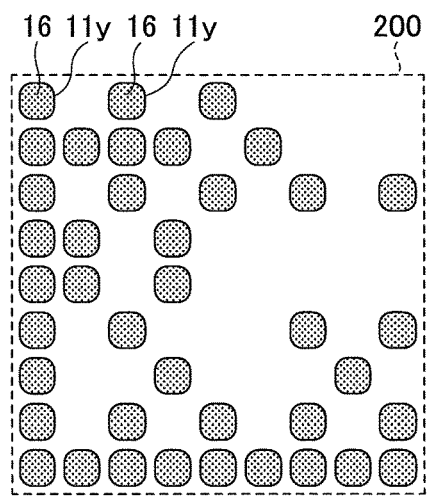
Figure 2C:
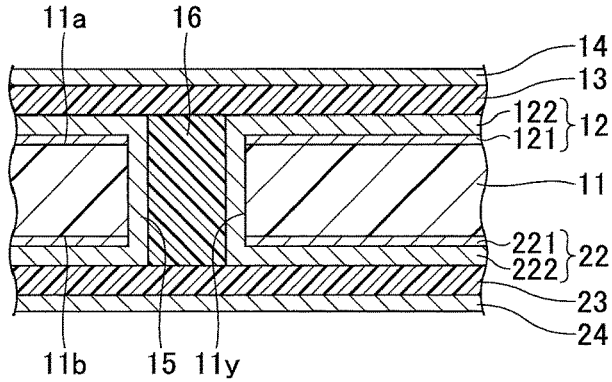

FIG. 2B is a plan view illustrating an example of a cell pattern created by forming penetrating holes 11y through the core layer 11 at selected cells 201 and by filling the penetrating holes 11y with the resin 16. FIG. 2C is an enlarged cross-sectional view of a cell and surrounding areas thereof taken from FIG. 2B. FIG. 2A and FIG. 2B does not show the insulating layer 13 and the interconnection layer 14.

As illustrated in FIG. 2A through FIG. 2C, the plan shape of the cell 201 and the plan shape of the penetrating hole 11y are identical. The inner wall of the penetrating hole 11y has the through interconnect 15 formed thereon, and the inner space of the through interconnect 15 is filled with the resin 16. It may be noted, however, that the penetrating holes 11y may be filled with resin 16 without the provision of the through interconnect 15 (see FIG. 7).

A first end face of the resin 16 is exposed on the same side as the first surface 11a of the core layer 11. A second end face of the resin 16 is exposed on the same side as the second surface 11b of the core layer 11. In the plan view, the interconnection layer 12 is formed in the surrounding area of the first end face of the resin 16. The number of interconnection layers on the first end face of the resin 16 is smaller than the number of interconnection layers on the first surface 11a of the core layer 11 in the surrounding area of the first end face of the resin 16. In the example illustrated in FIG. 2C, the number of interconnection layers over the first end face of the resin 16 is one (i.e., only the interconnection layer 14) whereas the number of interconnection layers over the first surface 11a of the core layer 11 in the surrounding area of the first end face of the resin 16 is two (i.e., the interconnection layers 12 and 14).

As described above, the barcode 200 is a two-dimensional barcode comprised of a cell pattern that is formed to represent predetermined information by selectively forming or not forming penetrating holes 11y in the core layer 11 at the respective cells 201. The predetermined information, which can be any type of information, may indicate process conditions for the interconnection substrate, a process history, the date of the process, the place of the process, product specifications (e.g., a product name, the number of interconnection layers, etc.), a serial number, a lot number, or the like.

In the barcode 200, the insulating layer 13 and the interconnection layer 14 are formed on the penetrating holes 11y. This structure does not allow the barcode 200 to be either visually detected or scanned by a conventional barcode reader that illuminates a barcode with light to read the information indicated by the cells based on the intensity of reflected light. Exposure to X-ray, however, enables the scanning of the cell pattern of the barcode 200 illustrated in FIG. 2B through the insulating layer 13 and the interconnection layer 14. This will later be described in detail.

[Method of Making Interconnection Substrate of First Embodiment]

In the following, a description will be given of the method of making an interconnection substrate of the first embodiment, with the focus on the method of making a barcode and the method of inspection by use of the barcode. FIGS. 3A through 3D are drawings illustrating an example of the process of making an interconnection substrate according to the first embodiment.

Figure 3A:
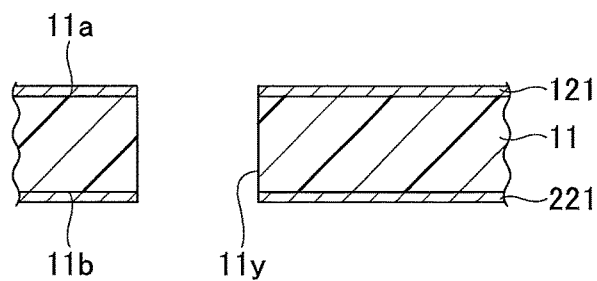
FIGS. 3A through 3D are drawings illustrating an example of the process of making the interconnection substrate according to the first embodiment.

In the process step illustrated in FIG. 3A, a structure (which will be made into the interconnection substrate 1) that has the metal layer 121 formed all over the first surface 11a of the core layer 11 and the metal layer 221 formed all over the second surface 11b is formed. The penetrating holes 11y are then formed at selected cells 201 of the barcode 200 in an area of the above-noted structure other than the product areas A such as to create the cell pattern illustrated in FIG. 2B, for example. The penetrating holes 11y may be formed one after another by use of a laser process or the like such as to penetrate the metal layer 121, the core layer 11, and the metal layer 221. The plan shape, size, and intervals of the penetrating holes 11y are the same as previously described.

After the formation of the barcode 200, the barcode 200 is scanned for the purpose of process control. Since neither an insulating layer nor an interconnection layer is situated over the penetrating holes 11y in this process step, either a conventional barcode reader that emits light or the use of X-ray exposure enables the scan of the barcode 200.

Figure 3B:
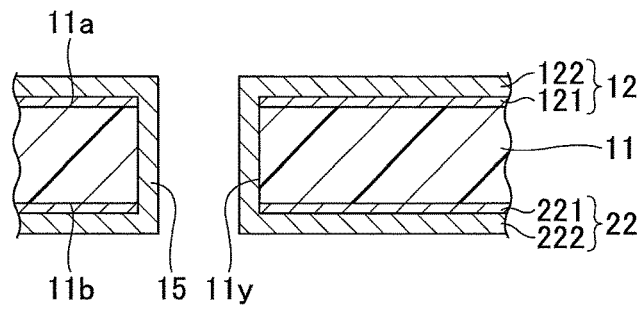

In the process step illustrated in FIG. 3B, the metal layer 122, the through interconnect 15, and the metal layer 222 are formed. For example, a non-electrolytic plating process may be employed to form a seed layer (e.g., copper layer) seamlessly covering the upper surface of the metal layer 121, the inner wall of the penetrating holes 11y, and the lower surface of the metal layer 221. An electrolytic plating process then forms a copper layer or the like by use of the seed layer as a feed layer, thereby forming the metal layer 122, the through interconnect 15, and the metal layer 222 as a seamless, continuous layer (the portion of this layer formed on the inner wall of the penetrating holes 11y is referred to as the through interconnect 15). The metal layer 121 and the portion of the metal layer 122 laminated thereon serve as the interconnection layer 12. The metal layer 221 and the portion of the metal layer 222 laminated thereon serve as the interconnection layer 22. It may be noted that in FIG. 3B, the seed layer is not illustrated (the same applies in the other drawings).

After the formation of the metal layer 122, the through interconnect 15, and the metal layer 222, the barcode 200 is scanned for the purpose of process control. Since neither an insulating layer nor an interconnection layer is situated over the penetrating holes 11y in this process step similarly to the process step illustrated in FIG. 3A, either a conventional barcode reader that emits light or the use of X-ray exposure enables the scan of the barcode 200.

Figure 3C:
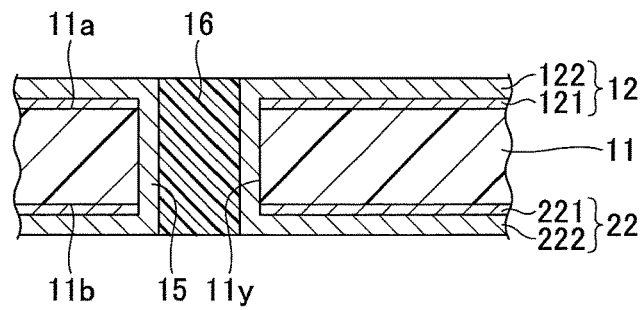

In the process step illustrated in FIG. 3C, the penetrating holes 11y are filled with the resin 16. In order to form the resin 16, a mask having openings that expose areas for forming the resin 16 is disposed on the upper surface of the interconnection layer 12, for example. Insulating resin such as epoxy-based resin that is to form the resin 16 is printed through the mask and then cured. If the resin 16 projects toward the upper side or toward the lower side from the penetrating holes 11y, such a projection is removed by buffing, by use of a belt sander, or the like. This ensures that the first end face of the resin 16 is flush with the upper surface of the metal layer 122, for example. Also, the second end face of the resin 16 is made flush with the lower surface of the metal layer 222, for example.

Figure 3D:
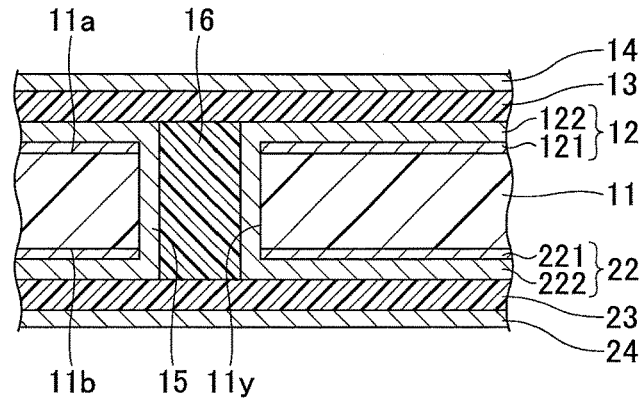

In the process step illustrated in FIG. 3D, the insulating layer 13 and the interconnection layer 14 are laminated on the interconnection layer and on the first end face of the resin 16, and the insulating layer 23 and the interconnection layer 24 are laminated on the interconnection layer and the second end face of the resin 16. Specifically, the insulating layer 13 is formed on the same side as the first surface 11a of the core layer 11 to cover the interconnection layer 12 and the first end face of the resin 16 through a laminate process. Also, the insulating layer 23 is formed on the same side as the second surface 11b of the core layer 11 to cover the interconnection layer 22 and the second end face of the resin 16 through a laminate process.

In the product areas A (not shown), the via holes 13x penetrating the insulating layer 13 to expose the upper surface of the interconnection layer 12 are formed through the insulating layer 13. Further, the via holes 23x penetrating the insulating layer 23 to expose the lower surface of the interconnection layer 22 are formed through the insulating layer 23. The via holes 13x and 23x may be formed by a laser process utilizing $CO_2$ laser or the like, for example.

Subsequently, the interconnection layer 14 is formed on the first surface of the insulating layer 13, and the interconnection layer 24 is formed on the second surface of the insulating layer 23. In the product areas A (not shown), the interconnection layer 14 is formed such that the interconnection layer 14 includes a via interconnect that fills a via hole 13x penetrating the insulating layer 13 to expose the first surface of the interconnection layer 12, and also includes an interconnection pattern formed on the first surface of the insulating layer 13. The interconnection layer 14 is electrically connected to the interconnection layer 12 that is exposed at the bottom end of the via hole 13x. The interconnection layer 24 is formed such that the interconnection layer 24 includes a via interconnect that fills a via hole 23x penetrating the insulating layer 23 to expose the second surface of the interconnection layer 22, and also includes an interconnection pattern formed on the second surface of the insulating layer 23. The interconnection layer 24 is electrically connected to the interconnection layer 22 that is exposed at the top end of the via hole 23x. Copper (Cu) or the like may be used as the material of the interconnection layers 14 and 24. The interconnection layers 14 and 24 may be formed by any suitable interconnect forming process such as a semi-additive process or a subtractive process.

After the formation of the insulating layers 13 and 23 and the interconnection layers 14 and 24, the barcode 200 is scanned for the purpose of process control. In this process step, the insulating layer 13 and the interconnection layer 14 are situated on the penetrating holes 11y. A typical barcode reader that emits light is thus unable to scan the barcode 200. Exposure to X-ray, however, enables the scanning of the information of the barcode 200 through the insulating layer 13 and the interconnection layer 14.

Figure 4A:
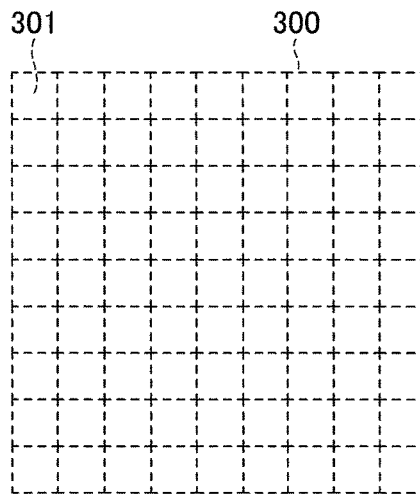
FIGS. 4A through 4D are drawings illustrating an example of the structure of a conventional barcode.
Figure 4B:
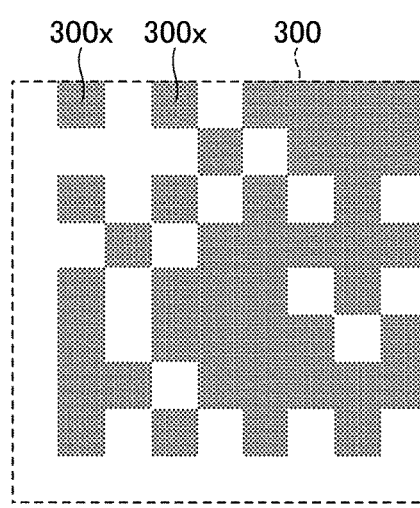

In the following, a description will be given of the characteristic features of the barcode 200 of the first embodiment by use of a comparative example. FIG. 4 is a drawing illustrating an example of the configuration of a barcode according to a comparative example. FIG. 4A is a plan view illustrating an example of the positions of cells 301. As illustrated in FIG. 4A, a plurality of rectangular cells 301 are arranged in contact with one another in a matrix in the area of a barcode 300. FIG. 4A shows a state before a cell pattern is formed.

Figure 4C:
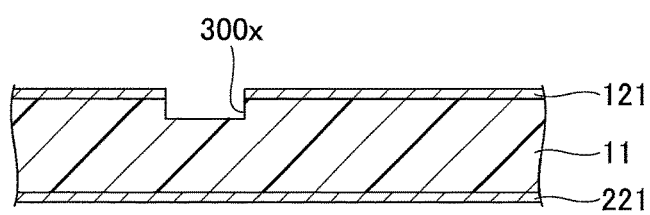

FIG. 43 is a plan view illustrating a cell pattern created by recesses 300x formed in the metal layer 121 and the core layer 11 at selected cells 301. FIG. 4C is an enlarged cross-sectional view of a cell and surrounding areas thereof taken from FIG. 43.

As described above, the barcode 300 is a two-dimensional barcode comprised of a cell pattern that is formed to represent predetermined information by selectively forming or not forming the recesses 300x in the metal layer 121 and the core layer 11 at the respective cells 301.

Figure 4D:
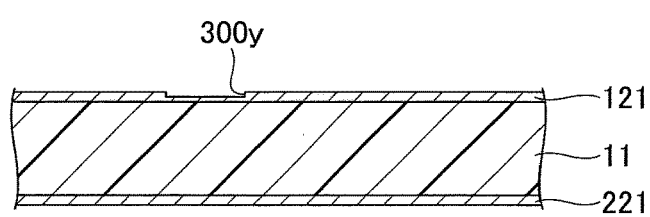

As illustrated in FIG. 4D, the barcode 300 may be a two-dimensional barcode comprised of a cell pattern that is formed to represent predetermined information by selectively forming or not forming recesses 300y in the metal layer 121 at the respective cells 301.

In the case of either FIG. 4C or FIG. 4D, each cell 301 of the barcode 300 does not have any structure formed by penetrating the core layer 11. The barcode 300 in the state illustrated in FIG. 4C or FIG. 4D can be scanned by a typical barcode reader that emits light.

Figure 5A:
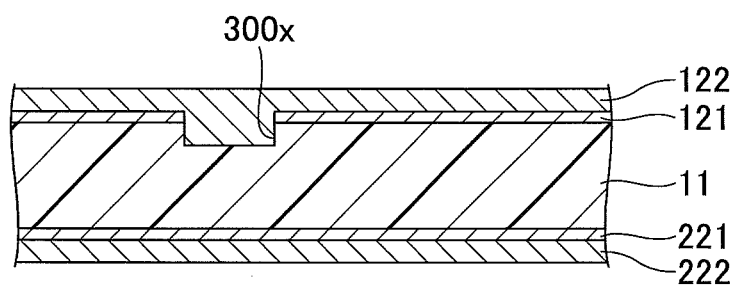
FIGS. 5A and 5B are drawings illustrating an example of part of the method of making an interconnection substrate according to the comparative example.
Figure 5B:
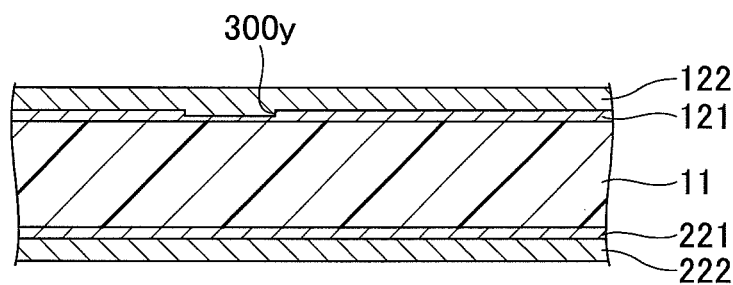

FIGS. 5A and 5B are drawings illustrating an example of part of the method of making an interconnection substrate according to the comparative example. A structure having the recess 300x as illustrated in FIG. 4C is subjected to a next process step illustrated in FIG. 5A in which a non-electrolytic process or the like forms the metal layers 122 and 222. Alternatively, a structure having the recess 300y as illustrated in FIG. 4D is subjected to a next process step illustrated in FIG. 58 in which a non-electrolytic process or the like forms the metal layers 122 and 222. In both cases, the metal layer 122 covers the recess 300x and 300y to remove any surface unevenness, thereby causing the color tones of the cell and the background to be the same. In this state, the barcode 300 cannot be scanned by a typical barcode reader that emits light, and, also, cannot be scanned through exposure of X-ray. The way in which the plurality of recesses 300x or 300y are buried is not uniform. Some recesses are completely filled while other recesses are not completely filled. Even the use of X-ray exposure is thus unable to allow a correct scan to be performed. The insulating layer 13 and the interconnection layer 14 may be formed on the metal layer 122 after the process step illustrated in FIG. 5A or 5B. Even after this, the barcode 300 cannot be scanned by a typical barcode reader that emits light, and, also, cannot be scanned through exposure to X-ray.

On the other hand, the barcode 200 of the present embodiment has the penetrating hole 11y serving as a cell that is not buried by a plating process as illustrated in FIG. 3B. The barcode 200 can thus be scanned immediately after the plating process by a typical barcode reader that emits light (and also can be scanned through exposure to X-ray). Further, exposure to X-ray enables a scan through the insulating layer 13 and the interconnection layer 14.

A first condition required for the information of the barcode 200 to be properly scanned by X-ray through the insulating layer 13 and the interconnection layer 14 is that the structure has the penetrating holes 11y filled with the resin 16. A second condition is that the first end face of the resin 16 is exposed on the same side as the first surface 11a of the core layer 11, such that the interconnection layer 12 is present on the surrounding area of the first end face of the resin 16 in the plan view but not present on the first end face of the resin 16. A third condition is that the number of interconnection layers over the first end face of the resin 16 exposed on the same side as the first surface 11a of the core layer 11 is smaller than the number of interconnection layers over the first surface 11a of the core layer 11 in the surrounding area of the first end face of the resin 16.

Satisfying the first through third conditions allows the information of the barcode 200 to be properly scanned through the insulating layer 13 and the interconnection layer 14 by use of X-ray exposure due to the contrast between the position of the first end face of the resin 16 exposed on the same side as the first surface 11a of the core layer 11 and the surrounding area of the first end face of the resin 16 exposed on the same side as the first surface 11a of the core layer 11.

As described heretofore, the barcode 200 of the present embodiment can be scanned in any process step by a typical barcode reader that emits light or through exposure to X-ray, which allows satisfactory process control to be performed.

The descriptions provided heretofore have been directed to an example in which the barcode 200 is formed in the interconnection substrate 1 outside the product areas A. However, the barcode 200 may be formed inside each product area A in the case of the barcode 200 having a relatively small occupying area, or in the case of interconnection density being relatively low in each product area A. In such a case, each of the interconnection substrates separated from each other has the barcode 200 formed therein.

<Variation of First Embodiment>

This variation of the first embodiment is directed to a configuration in which an additional barcode is provided. In connection with the variation of the first embodiment, a description of the same or similar constituent elements as those of the previously provided descriptions may be omitted as appropriate.

Figure 6A:
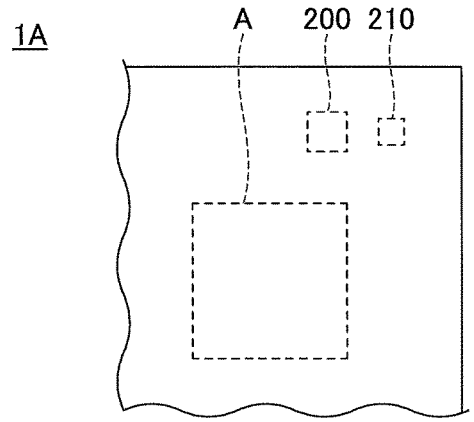
FIGS. 6A through 6C are drawings illustrating an example of an interconnection substrate according to a variation of the first embodiment.
Figure 6B:
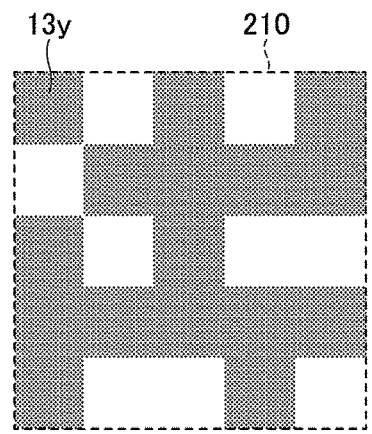
Figure 6C:
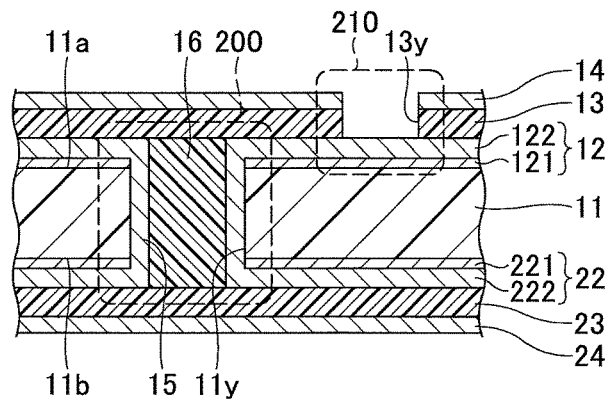

FIGS. 6A through 6C are drawings illustrating an example of an interconnection substrate according to the variation of the first embodiment. FIG. 6A is a plan view of part of an interconnection substrate 1A. FIG. 6B is a plan view of a barcode 210. FIG. 6C is an enlarged cross-sectional view of a cell of the barcodes 200 and 210 and the surrounding area thereof.

As illustrated in FIGS. 6A through 6C, the interconnection substrate 1A differs from the interconnection substrate 1 in that the barcode 210 is formed in addition to the barcode 200 at a different position from the barcode 200 in the plan view. The barcode 210 is a two-dimensional barcode having a plurality of defined cells.

Each cell of the barcode 210 is formed by use of a penetrating hole 13y penetrating the insulating layer 13 and the interconnection layer 14. The inside of the penetrating hole 13y is an empty space. The structure of the cells of the barcode 210 may be such that the individual cells are not in contact with one another similarly to the barcode 200. Alternatively, the structure of the cells of the barcode 210 may be such that the individual cells are in contact with one another similarly to the barcode 300. Each cell of the barcode 210 may have a structure made by forming a recess in the insulating layer 13 beneath a hole penetrating the interconnection layer 14 (similarly to the structure illustrated in FIG. 4C), or may have a structure made by forming a recess in the interconnection layer 14 (similarly to the structure illustrated in FIG. 4D).

In the barcode 210, neither an insulating layer nor an interconnection layer is formed over the penetrating hole 13y. With this configuration, the barcode 210 is viewable from the outside, and can be scanned by a typical barcode reader that emits light (and also can be scanned through exposure to X-ray). If solder resist or the like is to be applied on the interconnection layer 14, the solder resist or the like may have an opening that exposes the area at which the barcode 210 is arranged. With this configuration, the barcode 210 is viewable from the outside, and can be scanned by a typical barcode reader that emits light (and also can be scanned through exposure to X-ray).

The barcode 210 may have additional information recorded therein that relates to the information of the barcode 200, for example. The additional information may be regarding the manufacture of the interconnection layer 14, for example. The barcode 200 can be scanned by use of X-ray in the condition illustrated in FIG. 6C, which makes it suffice for the barcode 210 to record only the additional information. This configuration allows the number of cells in the barcode 210 to be fewer than the number of cells in the barcode 200. Accordingly, the occupying area of the barcode 210 may be made small.

It may be noted that the barcode 210 may have the information of the barcode 200 plus additional information recorded therein. In this case, the number of cells may not be smaller, but a typical barcode reader that emits light is able to scan the barcode 210 to read not only the additional information but also the information of the barcode 200. This is advantageous in that X-ray exposure is not necessary for the purpose of reading the barcode 200.

The descriptions provided heretofore have been directed to an example in which the barcodes 200 and 210 are formed in the interconnection substrate 1 outside the product areas A. However, the barcodes 200 and 210 may be formed inside each product area A in the case of the barcodes 200 and 210 having a relatively small occupying area, or in the case of interconnection density being relatively low in each product area A. In such a case, each of the interconnection substrates separated from each other has the barcodes 200 and 210 formed therein. Alternatively, the barcode 200 may be formed in the interconnection substrate 1 outside the product areas A while the barcode 210 is formed inside each product area A. In such a case, each of the interconnection substrates separated from each other has the barcode 210 formed therein.

<Second Embodiment>

The second embodiment is directed to an example of a barcode having a different cross-sectional structure than the first embodiment. In connection with the second embodiment, a description of the same or similar constituent elements as those of the previously provided descriptions may be omitted as appropriate.

Figure 7:
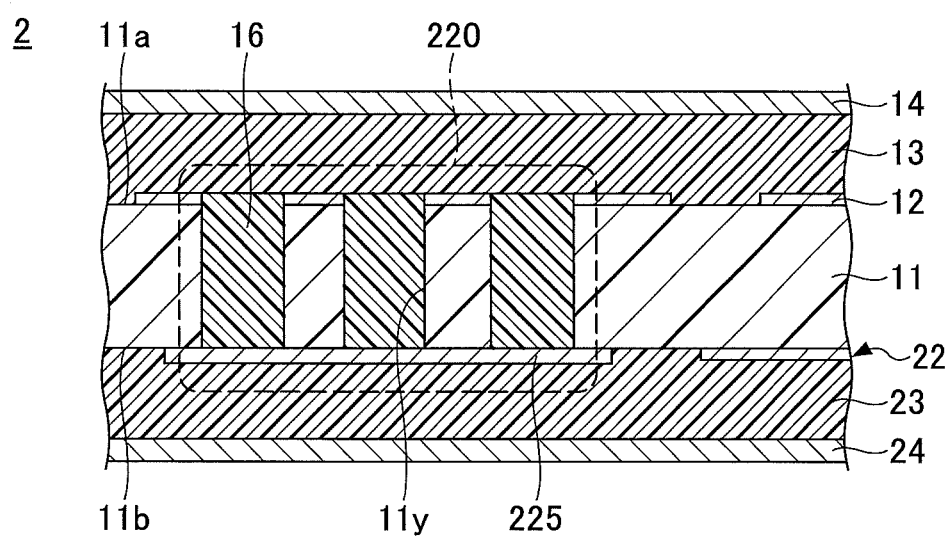
FIG. 7 is a drawing illustrating an example of another structure of a barcode formed in the interconnection substrate.

FIG. 7 is a partial cross-sectional view of the structure of a barcode formed in an interconnection substrate. This view illustrates three cells and the surrounding area thereof. The plan shape of an interconnection substrate 2 illustrated in FIG. 7 is the same as that of the interconnection substrate 1 illustrated in FIG. 1A. Further, the plan shape of the cells of a barcode 220 is the same as or similar to that of the barcode 200 illustrated in FIG. 2A and FIG. 2B. However, the cross-sectional shape of the barcode 220 differs from that of the barcode 200 illustrated in FIG. 2C. Specifically, the differences include the fact that each of the interconnection layers 12 and 22 is comprised of a single layer, the fact that no through interconnect 15 is formed, and the fact that the lower end of the penetrating hole 11y is covered with a pad 225 that is part of the interconnection layer 22.

In the following, a description will be given of the method of making an interconnection substrate of the second embodiment, with the focus on the method of making a barcode and the method of inspection by use of the barcode. FIGS. 8A through 8D are drawings illustrating an example of the process of making an interconnection substrate according to the second embodiment.

Figure 8A:
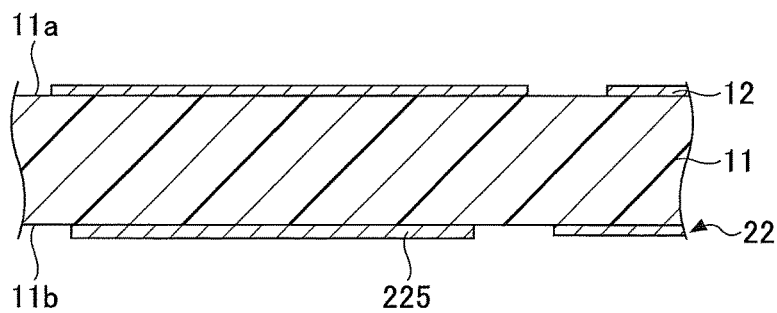
FIGS. 8A through 8D are drawings illustrating an example of the process of making an interconnection substrate according to the second embodiment.
Figure 8B:
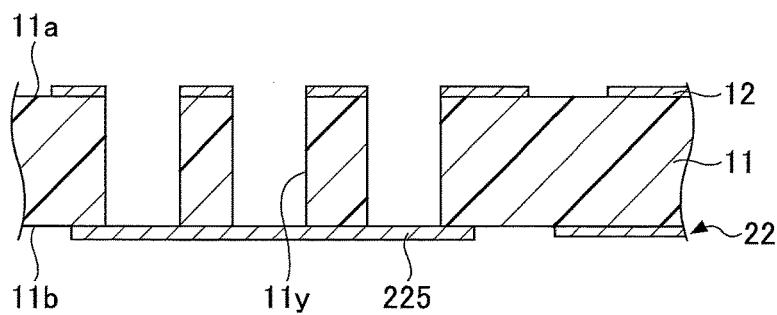

In the process step illustrated in FIG. 8A, a structure (which will be made into the interconnection substrate 2) that has a metal layer formed all over the first surface 11a of the core layer 11 and a metal layer formed all over the second surface 11b is first formed. Each metal layer is patterned into a desired shape by photolithography and etching, thereby forming the interconnection layers 12 and 22. When this is done, the interconnection layer 12 is left unremoved on the first surface 11a of the core layer 11 at the position where the penetrating holes 11y constituting the barcode 220 are to be formed. Further, the interconnection layer 22 is left unremoved to form the pad 225 on the second surface 11b of the core layer 11 at the position where the penetrating holes 11y constituting the barcode 220 are to be formed.

Subsequently in the process step illustrated in FIG. 83, the penetrating holes 11y constituting the barcode 220 are formed outside the product areas A to create the cell pattern illustrated in FIG. 2B, for example. The penetrating holes 11y may be formed one after another by a laser process or the like that penetrates the interconnection layer 12 and the core layer 11 to expose the upper surface of the pad 225.

Consequently, the penetrating holes 11y have open upper ends, and have lower ends closed with the pad 225. The plan shape, size, and intervals of the penetrating holes 11y are the same as previously described.

After the formation of the barcode 220, the barcode 220 is scanned for the purpose of process control. Since neither an insulating layer nor an interconnection layer is situated over the penetrating holes 11y in this process step, either a conventional barcode reader that emits light or the use of X-ray exposure enables the scan of the barcode 220.

Figure 8C:
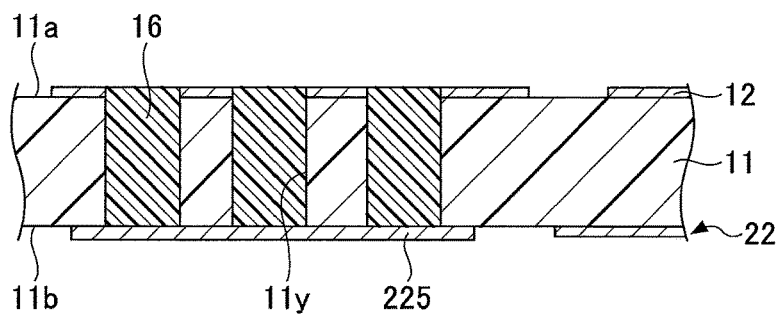
Figure 8D:
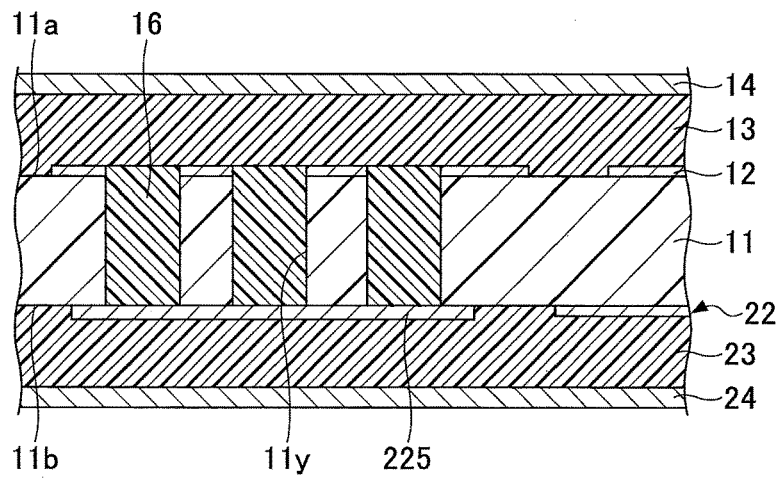

In the process step illustrated in FIG. 8C, the penetrating holes 11y are filled with the resin 16 similarly to the process step illustrated in FIG. 30. In the process step illustrated in FIG. 8D, the insulating layer 13 and the interconnection layer 14 are laminated on the interconnection layer 12, and the insulating layer 23 and the interconnection layer 24 are laminated on the interconnection layer 22, similarly to the process step illustrated in FIG. 3D. After the formation of the insulating layers 13 and 23 and the interconnection layers 14 and 24, the barcode 220 is scanned for the purpose of process control. In this process step, the insulating layer 13 and the interconnection layer 14 are situated on the penetrating holes 11y. A typical barcode reader that emits light is thus unable to scan the barcode 220. Exposure to X-ray, however, enables the scanning of the information of the barcode 220 through the insulating layer 13 and the interconnection layer 14.

Figure 9A:
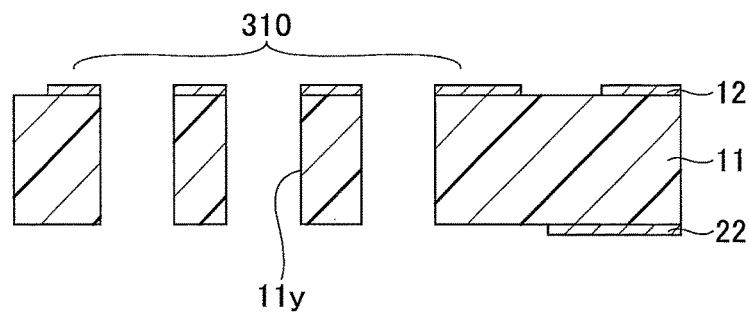
FIGS. 9A through 9C are drawings illustrating the characteristics of the barcode of the second embodiment.
Figure 9B:
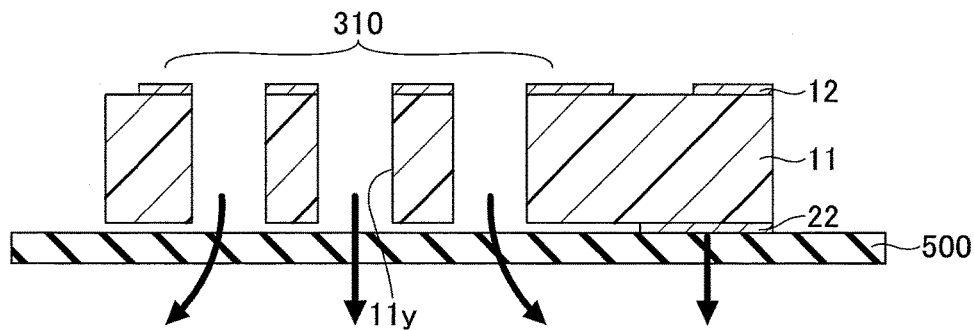
Figure 9C:
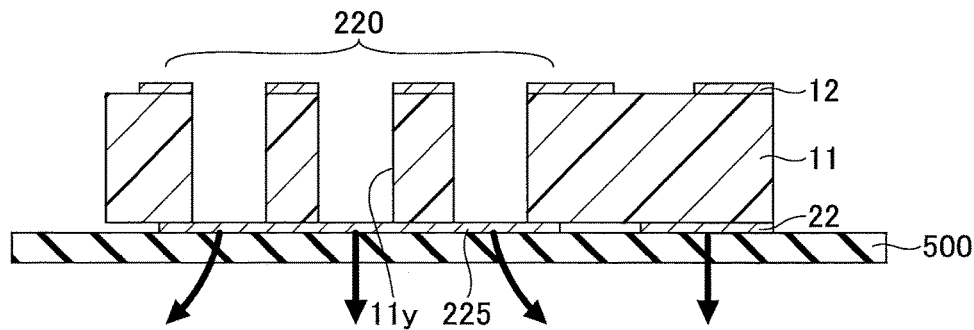

In the following, a description will be given of the characteristic features of the barcode 220 of the second embodiment by use of a comparative example. FIGS. 9A and 9B are drawings illustrating a barcode of a comparative example. FIG. 9C is a drawing illustrating the barcode 220 of the second embodiment.

As illustrated in FIG. 9A, a barcode 310 of the comparative example has no interconnection layer 22 that covers the lower end of the penetrating holes 11y. In such a case, using a vacuum chuck in the next process step to make an interconnection substrate stick thereto based on a suction force acting in the direction indicated by an arrow as illustrated in FIG. 9B results in the failure of suction due to leak through the penetrating holes 11y.

On the other hand, the barcode 220 of the second embodiment has the lower ends of the penetrating holes 11y covered with the pad 225. As illustrated in FIG. 9C, using a vacuum chuck in the next process step to make an interconnection substrate stick thereto based on a suction force acting in the direction indicated by an arrow as illustrated in FIG. 9C results in successful suction due to the prevention of leak through the penetrating holes 11y.

Further, although the preferred embodiments have been described, the present invention is not limited to these embodiments, and various variations and modifications may be made without departing from the scope of the present invention.

According to at least one embodiment, an interconnection substrate is provided that has a barcode readable even after an insulating layer and/or an interconnection layer are laminated on the barcode.

The present disclosures non-exhaustively include the subject matter set out in the following clauses:

1. An interconnection substrate having a barcode formed therein, comprising:
a core layer;
an interconnection layer formed over a first surface of the core layer;
an insulating layer formed over the first surface of the core layer to cover the interconnection layer; and
one or more additional interconnection layers formed over the insulating layer,
wherein the barcode includes a plurality of cells arranged at spaced intervals, and a cell pattern indicative of predetermined information is made by forming penetrating holes through the core layer in some of the cells but not in remaining ones of the cells,
wherein the penetrating holes are filled with resin, and a first end face of the resin is exposed on the same side as the first surface of the core layer such that the interconnection layer is situated in a surrounding area of the first end face but not over the first end face, and
wherein a number of the one or more additional interconnection layers over the first end face is smaller than a total number of the interconnection layer plus the one or more additional interconnection layers over the first surface of the core layer in the surrounding area of the first end face.

2. A method of inspecting the interconnection substrate of clause 1, comprising:
emitting light onto the barcode to scan the barcode after forming the penetrating holes through the core layer and before forming the interconnection layer and the insulating layer over the first surface of the core layer,
emitting X-ray onto the barcode to scan the barcode after filling the penetrating holes with the resin, after forming the interconnection layer and the insulating layer over the first surface of the core layer, and after forming the one or more additional interconnection layers over the insulating layer.

3. The method as described in clause 2, further comprising emitting light onto an additional barcode to scan the additional barcode after forming the additional barcode indicative of information associated with information of the barcode, the additional barcode being formed at a different position than the barcode in a plan view.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. An interconnection substrate having a barcode formed therein, comprising:
a core layer;
an interconnection layer Rained over a first surface of the core layer;
an insulating layer formed over the first surface of the core layer to cover the interconnection layer; and
one or more additional interconnection layers formed over the insulating layer,
wherein the barcode includes a plurality of cells arranged at spaced intervals, and a cell pattern indicative of predetermined information is made by forming pen- etrating holes through the core layer in some of the cells but not in remaining ones of the cells, wherein the penetrating holes are filled with resin, and a first end face of the resin is exposed on the same side as the first surface of the core layer such that the interconnection layer is situated in a surrounding area of the first end face but not over the first end face, and wherein a number of the one or more additional interconnection layers over the first end face is smaller than a total number of the interconnection layer plus the one or more additional interconnection layers over the first surface of the core layer in the surrounding area of the first end face.

2. The interconnection substrate as claimed in claim 1, further comprising a plurality of product areas, the barcode being formed outside the product areas.

3. The interconnection substrate as claimed in claim 1, wherein an end of the penetrating holes on the same side as a second surface of the core layer opposite the first surface thereof is covered with a pad formed on the second surface of the core layer.

4. The interconnection substrate as claimed in claim 1, wherein the barcode is a first barcode, and a second barcode indicative of information associated with information of the first barcode is formed at a different position than the first barcode in a plan view, the second barcode being viewable from outside the interconnection substrate.

5. The interconnection substrate as claimed in claim 4, wherein the second barcode includes a plurality of cells, and a cell pattern indicative of predetermined information is made by forming recesses or penetrating holes in an outermost layer among the one or more additional interconnection layers in some of the cells of the second barcode but not in remaining ones of the cells of the second barcode.

6. The interconnection substrate as claimed in claim 4, wherein a number of the cells of the second barcode is smaller than a number of the cells of the first barcode, and the predetermined information indicated by the second barcode is additional information relating to the predetermined information indicated by the first barcode.

7. An interconnection substrate having a barcode formed therein, comprising:

a core layer; and one or more interconnection layers having one or more metal patterns formed over or under the core layer, wherein the barcode includes a plurality of cells, with penetrating holes made through the core layer in some of the cells but not in remaining ones of the cells, wherein a total number of the one or more metal patterns over and under a given one of the penetrating holes is smaller than a total number of the one or more metal patterns in a surrounding area of the given one of the penetrating holes.

* * * * *